United States Patent [19]

Fuls et al.

[11] 4,450,620

[45] May 29, 1984

[54] FABRICATION OF MOS INTEGRATED CIRCUIT DEVICES

[75] Inventors: Ellis N. Fuls, Bernardsville; Nadia Lifshitz, New Providence; Sheila Vaidya, Bridgewater, all of N.J.

[73] Assignee: Bell Telephone Laboratories, Incorporated, Murray Hill, N.J.

[21] Appl. No.: 468,032

[22] Filed: Feb. 18, 1983

[51] Int. Cl.³ .................... H01L 21/74; H01L 21/265
[52] U.S. Cl. .................................... 29/571; 29/576 B; 148/1.5; 148/187
[58] Field of Search .................. 29/571, 576 B, 577 C, 29/578, 591; 148/1.5, 187; 357/23, 59, 71, 91

[56] References Cited

U.S. PATENT DOCUMENTS

| | | | |
|---|---|---|---|
| 4,180,596 | 12/1979 | Crowder et al. | 427/42 |
| 4,276,688 | 7/1981 | Hsu | 29/571 |
| 4,329,706 | 5/1982 | Crowder et al. | 357/71 |
| 4,339,869 | 7/1982 | Reihl et al. | 29/576 B |
| 4,343,082 | 8/1982 | Lepselter et al. | 29/576 B |

FOREIGN PATENT DOCUMENTS

| | | | |
|---|---|---|---|
| 0068154 | 1/1983 | European Pat. Off. | 29/571 |
| 0072967 | 3/1983 | European Pat. Off. | 29/571 |
| 55-121666 | 9/1980 | Japan | 29/571 |
| 57-13755 | 1/1982 | Japan | 29/571 |

*Primary Examiner*—Aaron Weisstuch
*Attorney, Agent, or Firm*—Lucian C. Canepa

[57] ABSTRACT

In an MOS integrated circuit device, a multilayer polysilicon/metallic-silicide gate-level metallization structure is patterned to form gates and associated interconnects. Some of the interconnects are designed to make contact with ohmic regions in the single-crystalline body of the device. In accordance with a simplified fabrication procedure, a single implantation step is utilized to dope the metallic silicide while doping selected portions of the body. During a subsequent heating step, source, drain and ohmic contact regions are formed in the body. During the same step, the dopant in the metallic silicide diffuses into underlying layers of polysilicon and into body portions directly underlying polysilicon in amounts sufficient to render the polysilicon conductive and to form additional ohmic contact regions in the body.

19 Claims, 6 Drawing Figures

FABRICATION OF MOS INTEGRATED CIRCUIT DEVICES

BACKGROUND OF THE INVENTION

This invention relates to metal-oxide-semiconductor (MOS) integrated circuit devices and, more particularly, to a method for fabricating such devices.

In one MOS integrated circuit device design of practical importance, a multilayer polysilicon/metallic-silicide gate-level metallization structure is patterned to form gates and associated interconnects. Some of the interconnects are designed to make contact with ohmic regions in the single-crystalline body of the device. An advantageous fabrication procedure for making such a device is described in detail in a copending commonly assigned application of E. N. Fuls and H. J. Levinstein, Ser. No. 437,796, filed Oct. 29, 1982.

In accordance with the procedure described in the aforecited application, the polysilicon in the gate-level metallization is doped in a high-temperature diffusion step to render the polysilicon conductive. At the same time, ohmic contacts are thereby formed in the single-crystalline body of the device. Advantageously, a layer of a metallic silicide is subsequently formed on the doped polysilicon thereby to provide an especially low-resistance gate-level metallization.

In one particular procedure described in the Fuls-Levinstein application, the body of the device is made of silicon and the specified dopant comprises phosphorus. Due to the relatively high diffusivity of phosphorus in silicon, two ohmic contacts in the body of such a device cannot in practice be located less than about two micrometers apart. This of course imposes a limitation on the degree of integration achievable in the device.

In a specific alternative procedure for making MOS integrated circuit devices, arsenic is utilized to dope the polysilicon of the device in a first ion implantation step. A metallic silicide layer is then formed on the polysilicon. The silicide and the underlying polysilicon are then patterned. Next, in a second arsenic implant, dopants are introduced into the source and drain regions of the device. Subsequently, during a heating cycle in which the source and drain regions are exactly defined, the patterned polysilicon is rendered conductive and small-size ohmic contacts are formed in the body of the device.

The aforespecified alternative procedure is an attractive one for making MOS integrated circuit devices. But the procedure does require two separate ion implantation steps, which steps are relatively time-consuming and expensive. Moreover, the requirement of making two implants increases the probability that the characteristics of the gate oxide layer included in the device may be deleteriously affected.

Accordingly, workers in the art have expended continuing efforts directed at trying to simplify and improve the procedure for fabricating MOS integrated circuit devices. It was recognized that such efforts, if successful, could lower the cost and improve the quality of these commercially significant devices.

SUMMARY OF THE INVENTION

Hence, an object of the present invention is an improved method for fabricating MOS integrated circuit devices. More specifically, an object of this invention is such a method requiring only a single ion implantation step.

Briefly, these and other objects of the present invention are realized in a specific illustrative embodiment thereof that comprises a simplified fabrication procedure for an MOS integrated circuit device. In accordance with this procedure, a multilayer metallic silicide-on-polysilicon gate-level structure is patterned to form gates and associated interconnects. Some of the interconnects are designed to make contact with ohmic regions in the single-crystalline body of the device. A single implantation step is utilized to dope the metallic silicide while doping selected portions of the body. During a subsequent heating step, source, drain and ohmic contact regions are formed in the body. During the same step, the dopant in the metallic silicide diffuses into underlying layers of polysilicon in amounts sufficient to render the polysilicon conductive. Moreover, regions underlying polysilicon that is in direct contact with the body are thereby rendered conductive and become part of the ohmic contact regions.

BRIEF DESCRIPTION OF THE DRAWING

A complete understanding of the present invention and of the above and other features thereof may be gained from a consideration of the following detailed description presented hereinbelow in connection with the accompanying drawing, in which.

DETAILED DESCRIPTION

Figure 1:
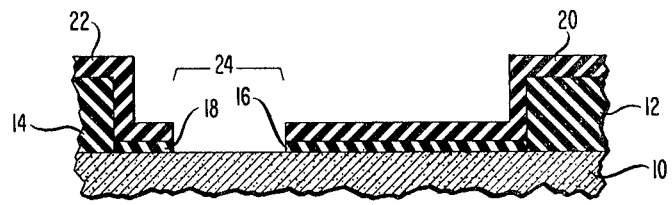
FIGS. 1 through 6 are schematic cross-sectional depictions, not drawn to scale, at various steps in a device fabrication procedure carried out in accordance with the principles of the present invention.

A portion of a partially fabricated MOS integrated circuit device is schematically depicted in FIG. 1. For purposes of a specific illustrative example, the depicted device is assumed to be a part of a very-large-scale integrated circuit formed on a semiconductive body that comprises a p-type region 10 made of single-crystalline silicon. Thus, the particular illustrative structure to be described herein can be considered to be an n-channel MOS (NMOS) integrated circuit device or a part of a complementary MOS (CMOS) integrated circuit device.

The specific illustrative FIG. 1 device includes conventional field-oxide portions 12, 14 and gate-oxide portions 16, 18. Each of these portions is made of silicon dioxide that was formed in a standard thermal oxidation step. Illustratively, the portions 12, 14 are each approximately 4000 Angstrom units thick, and the portions 16, 18 are each about 250 Angstrom units thick. Additionally, the device includes portions 20, 22 made of undoped polycrystalline silicon formed in a low-pressure chemical-vapor-deposition (LPCVD) step in a manner known in the art. By way of example, the portions 20, 22 are each approximately 1500 Angstrom units thick. As described in the aforecited Fuls-Levinstein application, the purpose of the depicted polysilicon is to protect underlying gate oxide from contamination and erosion during subsequent lithography in which window region 24 is patterned.

In a prior step of the fabrication sequence utilized to form the FIG. 1 device, the polysilicon and silicon dioxide layers thereof were etched to form window region 24. Illustratively, this was priorly done in a conventional two-step reactive sputter (or ion) etching process in which a plasma derived from chlorine was employed to anisotropically etch the polysilicon and a plasma derived from trifluoromethane and ammonia was utilized to anisotropically etch the silicon dioxide.

Figure 2:
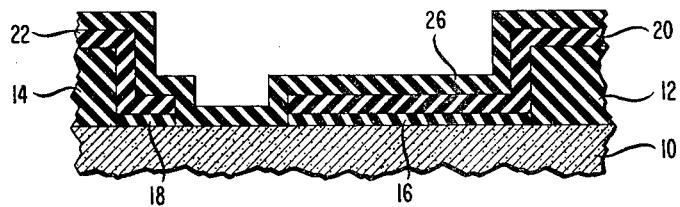

Next, in a standard LPCVD step, a layer of undoped polysilicon approximately 2500 Angstrom units thick is deposited on the surface of the FIG. 1 device. The resulting structure, including newly deposited polysilicon layer 26, is shown in FIG. 2. A portion of the layer 26 in the window region 24 will later, when suitably doped in accordance with a feature of applicants' inventive procedure, be rendered conductive. This conductive portion will constitute a polysilicon contact (polycon) for establishing electrical contact to an ohmic region to be formed in the region 10 underlying the polycon.

It is known to utilize a refractory metal silicide on polysilicon to achieve a high conductivity gate-level metallization for MOS devices. Specific examples of such silicide-on-polysilicon composite structures are described in U.S. Pat. No. 4,276,557, issued to H. J. Levinstein, S. P. Murarka and A. K. Sinha, and in a copending commonly assigned application of H. J. Levinstein, S. P. Murarka and A. K. Sinha, Ser. No. 296,914, filed Aug. 27, 1981. Additional details concerning the use of silicide-on-polysilicon composites in MOS devices are contained in an article by S. P. Murarka et al entitled "Refractory Silicides of Titanium and Tantalum for Low-Resistivity Gates and Interconnects," *IEEE Journal of Solid-State Circuits*, Vol. SC-15, No. 4, August 1980, pages 474–482.

In accordance with the principles of the present invention, a metallic silicide, for example tantalum silicide or cobalt silicide, is included in the device described herein. For purposes of a specific illustrative example, emphasis herein will be directed to a particular MOS device that includes a layer of tantalum silicide formed on the polysilicon layer 26 shown in FIG. 2.

Figure 3:
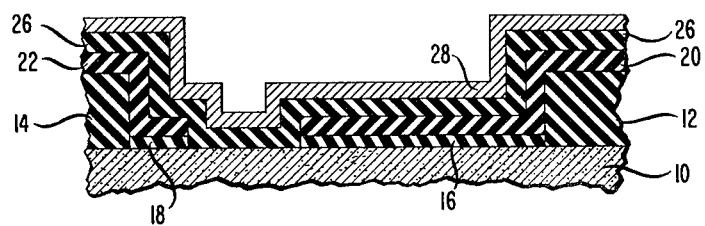

Advantageous techniques for forming and anisotropically patterning tantalum silicide are described in a copending commonly assigned application of J. S. Deslauriers and H. J. Levinstein, Ser. No. 449,441, filed Dec. 13, 1982. In accordance with one of the techniques described therein, a layer 28 of tantalum and silicon is co-sputter-deposited on the polysilicon layer 26, as indicated in FIG. 3. Illustratively, the layer 28 is approximately 2500 Angstrom units thick.

Figure 4:
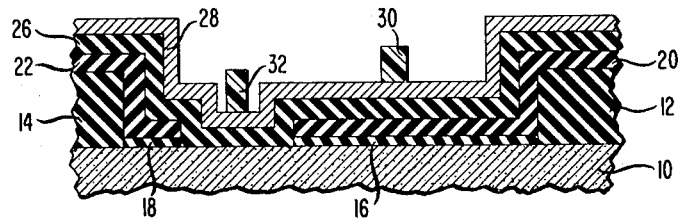

Thereafter, by standard lithographic procedures, a resist pattern is formed on the layer 28. Resist elements 30, 32 of such a pattern are represented in FIG. 4. By way of example, each of the elements 30, 32 is approximately two micrometers thick and one micrometer wide.

In the next steps of applicants' inventive fabrication sequence, the resist elements 30, 32 are utilized as an etch-resistant mask for anisotropically patterning the underlying layers 28, 26 and 20. Portions of these layers directly underlying the element 30 will constitute the gate electrode of the herein-considered MOS device. Portions of the layers 28, 26 directly underlying the element 32 will constitute a conductivity-enhanced polycon region of the device.

Patterning of the tantalum-silicon layer 28 included in the FIG. 4 device is carried out, for example, in a reactive sputter etching step by utilizing a plasma containing active etchant fluorine constituents, as described in the aforecited Deslauriers-Levinstein application. A suitable such plasma is derived from $CCl_3F$ (Freon 11). In this step, the entire thickness of the unmasked portions of the layer 28 and some part of the thickness of the unmasked portions of the polysilicon layer 26 are removed. In a subsequent step, the remaining thickness of the unmasked portions of the polysilicon layer 26 and the entire thickness of the unmasked portions of the polysilicon layer 20 are removed. Advantageously, this subsequent step also comprises a reactive sputter etching step. By way of illustration, this polysilicon etching step is carried out in a plasma containing active etchant chlorine constituents, for example in a plasma derived from pure or essentially pure $Cl_2$. At the completion of this two-step etching procedure, the resist elements 30, 32 are removed from the depicted device. This is done, for example, by conventional chemical dissolution techniques.

The aforedescribed remaining portions of the tantalum-silicon layer 28 are then sintered. This is carried out, for example, in a pure argon atmosphere at about 900 degrees Celsius for approximately one-half hour. This converts the remaining portions of the layer 28 to tantalum silicide.

Figure 5:
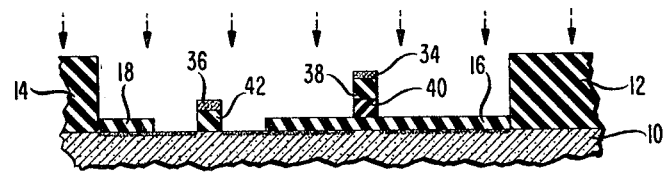

As a result of the two-step etching procedure and sintering step, the MOS device being fabricated comprises tantalum silicide portions 34, 36 and polysilicon portions 38, 40, 42, as shown in FIG. 5. In accordance with the principles of the present invention, the device of FIG. 5 is then subjected to bombardment in an ion implantation step. This is schematically represented in FIG. 5 wherein arrows 44 indicate that the entire top surface of the device is subjected to an incident ion beam. As will be described below, this step provides the basis for forming source, drain and ohmic contact regions in the body 10 and conductive polysilicon regions overlying the body 10.

Illustratively, in the implantation step represented in FIG. 5, arsenic dopant ions at an energy of about 60 kilo-electron-volts and at a dosage of approximately $7 \times 10^{15}$ ions per square centimeter are directed at the indicated device. Selected surface portions of the body 10 are thereby implanted with arsenic ions, as schematically indicated by dots in those portions. Additionally, the silicide portions 34, 36 are implanted with arsenic ions, as also depicted by dots. Arsenic ions do not, however, pass through the silicide portions 34, 36 into the underlying polysilicon portions 38, 40, 42. Further, surface portions of the body 10 underlying the field-oxide portions 12, 14 have no ions implanted therein. Nor do surface portions of the body 10 directly underlying the silicide portion 34, 36 have ions implanted therein. By way of example, the shallow implanted portions in the body 10 extend about 300 Angstrom units below the top surface of the body 10.

Figure 6:
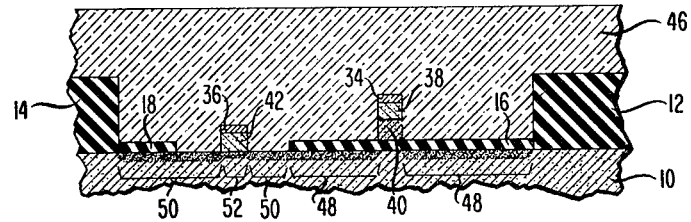

Next, a relatively thick insulating layer (a so-called intermediate dielectric) is formed on the entire top surface of the MOS device. Such a layer 46 is shown in FIG. 6. Illustratively, the layer 46 is approximately 1.5 micrometers thick. Advantageously, the layer 46 is formed in a standard CVD step from a source comprising tetraethylorthosilicate and triethyl phosphite. The resulting conventional material is commonly referred to as PTEOS glass, which exhibits good step coverage.

Illustratively, the MOS device including the PTEOS glass layer 46 (FIG. 6) is later processed in a standard fashion in a gettering cycle. (Gettering is one of the last steps in the fabrication sequence. It typically occurs long after windows, described below, are formed in the layer 46.) Gettering is done, for example, in a phosphorous-rich atmosphere at a temperature of approximately 900-to-950 degrees Celsius for about one hour. As a result of this later heating step, which occurs normally anyway even in typical prior art fabrication sequences, arsenic ions previously implanted in shallow surface portions of the body 10 are activated and driven into the body vertically and laterally to form n+-p junctions. Significantly, because of the relatively small diffusion coefficient of arsenic in silicon, these vertical and lateral diffusions extend only about 0.25 micrometers from the original shallow implants. Hence, relatively shallow spaced-apart source and drain junction regions 48 are thereby defined in the body 10. Additionally, n+-p junction regions 50 are thereby defined in the body 10. These regions also extend vertically and laterally only about 0.25 micrometers from the original shallow implants.

In accordance with the principles of the present invention, arsenic dopant ions in the silicide portions 34, 36 are driven therefrom during the aforespecified standard heating step into the underlying polysilicon portions 38, 40, 42 to render those portions conductive. Moreover, sufficient quantities of the dopant ions formerly in the silicide portion 36 are also thereby driven through the polysilicon portion 42 into a surface region 52 of the body 10 to conductively bridge the regions 50.

As a consequence of the aforespecified heating step (which, illustratively, actually occurs later during gettering, as mentioned above), the formation in the FIG. 6 device of a composite high-conductivity silicide (portion 34)-on-polysilicon (portions 38, 40) gate electrode is completed. At the same time, source and drain n+-p junction regions 48 associated with the gate electrode are formed in the body 10. In the same step, the formation of a composite high-conductivity silicide (portion 36)-on-polysilicon (portion 42) polycon is completed. Additionally, high-conductivity ohmic contact n+-p junction regions 50, 52 are thereby formed in the body 10. These ohmic contact regions constitute the instrumentality for electrically interconnecting the aforespecified polycon structure to one of the source and drain regions 48. In that way, conventional patterning of the herein-described gate-level metallization provides a basis for selectively interconnecting multiple gate, source and drain electrodes in an MOS integrated circuit device, as is known in the art.

In further standard steps, contact windows are etched through specified portions of the glass layer 46 (FIG. 6) to access preselected surface regions of the silicide portions 34, 36. A suitable contact material is then deposited on the entire top surface of the layer 46 and in the aforespecified windows formed in the layer 46. Advantageously, the contact material comprises a two-layer composite of aluminum-on-doped polysilicon. Thereafter, the aluminum-polysilicon composite is selectively etched in a conventional way to form a specified interconnection pattern. Further standard steps well known in the art are then employed to complete the fabrication of the herein-described MOS device.

Finally, it is to be understood that the above-described arrangements and techniques are only illustrative of the principles of the present invention. In accordance with these principles, numerous modifications and alternatives may be devised by those skilled in the art without departing from the spirit and scope of the invention.

What is claimed is:

1. A method of fabricating an MOS integrated circuit device that comprises metallic silicide-on-polysilicon-on-gate oxide-on-single-crystalline silicon portions, said method comprising in a single ion implantation step, doping regions in said single-crystalline silicon and, at the same time, doping said metallic silicide, and heating said device to define source and drain regions therein and, at the same time, to cause the dopants in said metallic silicide to diffuse to render the underlying polysilicon conductive.

2. A method of fabricating an MOS integrated circuit device that comprises metallic silicide-on-polysilicon-on-gate oxide-on-single-crystalline silicon portions and metallic silicide-on-polysilicon-on-single crystalline silicon portions, said method comprising in a single ion implantation step, doping source, drain and ohmic contact regions in said single-crystalline silicon and, at the same time, doping said metallic silicides, and heating said device to define source, drain and ohmic contact regions therein and, at the same time, to cause the dopants in said metallic silicides to diffuse to render the underlying polysilicon conductive and to render conductive the single-crystalline silicon underlying the polysilicon.

3. A method as in claim 2 wherein, prior to said heating step, an insulating layer is formed on the entire top surface of said device.

4. A method as in claim 3 wherein said single-crystalline silicon is p-type, and said implanting step involves implanting arsenic ions at an energy of approximately 60 kilo-electron-volts at a dose of about $7 \times 10^{15}$ ions per square centimeter.

5. A method as in claim 4 wherein said heating step involves heating said device in a phosphorous-rich atmosphere at about 900-to-950 degrees Celsius for approximately one hour.

6. A method as in claim 5 wherein said insulating layer is made of PTEOS glass.

7. A method of fabricating an MOS integrated circuit device of the type that includes MOS transistors each having spaced-apart source and drain portions formed in a single-crystalline silicon region, at least some of said transistors having associated therewith an ohmic contact portion formed in said region for establishing electrical contact with either of associated source and drain portions, each said transistor further having associated therewith a metallic silicide-on-polysilicon contact portion overlying said ohmic contact portion and each transistor comprising a metallic silicide-on-polysilicon-on-gate oxide portion overlying a portion in said single crystalline silicon region between said source and drain portions, said method comprising:

in a single ion implantation step, doping said source and drain portions, said metallic silicide and said ohmic contact portion except for the portion directly underlying said metallic silicide-on-polysilicon contact portion, forming an insulating layer on the entire top surface of said device, and heating said insulating layer to cause the dopants introduced into said source, drain and ohmic contact portions to diffuse vertically and laterally to define the final extents of such portions in said device and to cause the dopants introduced into the metallic silicide to diffuse into the underlying polysilicon to render said polysilicon conductive and into the ohmic contact portion directly underlying said metallic silicide-on-polysilicon contact portion to render said portion conductive.

8. A method as in claim 7 wherein said silicon region is p-type and said dopants are n-type.

9. A method as in claim 8 wherein said implanting step involves implanting arsenic ions at an energy of approximately 60 kilo-electron-volts and a dose of approximately $7 \times 10^{15}$ ions per square centimeter.

10. A method as in claim 9 wherein said insulating layer is made of PTEOS glass, and said heating step is carried out at approximately 900-to-950 degrees Celsius for approximately one hour.

11. A method as in claim 10 wherein said metallic silicide comprises tantalum silicide.

12. A method of making an MOS integrated circuit device, comprising the steps of
forming a structure comprising a metallic silicide-on-polysilicon pattern on a silicon body, said pattern comprising polysilicon portions in direct contact with the surface of said body and other polysilicon portions spaced apart from the surface of said body by a relatively thin insulating layer,
implanting a dopant into the silicide portions of said pattern and into selected regions of said body that are uncovered or covered only with said relatively thin insulating layer,
forming a relatively thick insulating layer on the entire top surface of said structure,
and heating said structure to cause dopants in said silicide portions to diffuse into the polysilicon portions thereunder and into those portions of the body that have polysilicon directly thereover to render those polysilicon portions and body portions conductive and to cause the dopants in the selected regions of said body to diffuse therein to define source, drain and ohmic contact regions, said ohmic contact regions being electrically bridged by said conductive body portions and electrically contacting source or drain regions in said body.

13. A method as in claim 12 wherein said metallic silicide is tantalum silicide.

14. A method as in claim 13 wherein said body comprises p-type silicon.

15. A method as in claim 14 wherein said relatively thin insulating layer comprises a gate oxide layer.

16. A method as in claim 15 wherein the implanted dopant comprises arsenic.

17. A method as in claim 16 wherein arsenic is implanted at 60 kilo-electron-volts at a dose of $7 \times 10^{15}$ ions per square centimeter.

18. A method as in claim 17 wherein said relatively thick insulating layer comprises PTEOS glass.

19. A method as in claim 18 wherein said heating step is carried out in a phosphorous-rich atmosphere at about 900-to-950 degrees Celsius for about one hour.

* * * * *